United States Patent
Ito et al.

(10) Patent No.: US 8,017,670 B2
(45) Date of Patent: Sep. 13, 2011

(54) EPOXY RESIN COMPOSITION FOR OPTICAL-SEMICONDUCTOR ENCAPSULATION, CURED RESIN THEREOF, AND OPTICAL SEMICONDUCTOR DEVICE OBTAINED WITH THE SAME

(75) Inventors: Hisataka Ito, Osaka (JP); Shinya Ota, Osaka (JP); Kazuhiro Fuke, Osaka (JP); Shinjiro Uenishi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 307 days.

(21) Appl. No.: 11/855,267

(22) Filed: Sep. 14, 2007

(65) Prior Publication Data

US 2008/0114101 A1 May 15, 2008
US 2010/0041799 A2 Feb. 18, 2010

(30) Foreign Application Priority Data

Sep. 21, 2006 (JP) .................... 2006-255410
May 31, 2007 (JP) .................... 2007-145913

(51) Int. Cl.
C08L 63/00 (2006.01)
H01L 21/00 (2006.01)
C08K 5/34 (2006.01)
(52) U.S. Cl. ............. 523/400; 438/127; 524/88
(58) Field of Classification Search ............. 523/400
See application file for complete search history.

(56) References Cited

FOREIGN PATENT DOCUMENTS

| EP | 0433220 A2 | 6/1991 |
| EP | 1524285 A1 | 4/2005 |
| JP | 2000313788 A * | 11/2000 |
| JP | 2002-226678 A | 8/2002 |
| JP | 2002226678 A * | 8/2002 |
| JP | 2004-182857 A | 7/2004 |
| JP | 2004-315789 A | 11/2004 |
| JP | 2005-187226 A | 7/2005 |
| JP | 2006-206846 A | 8/2006 |

OTHER PUBLICATIONS

English machine translation of JP 2002-226678 A, Hirose et al, Aug. 14, 2002.*
English machine translation of JP 2000-313788 A, Chichiwa et al, Nov. 14, 2000.*
European Search Report dated Jan. 2, 2008.
Korean Office Action issued in Application No. 10-2007-0095811, dated Dec. 30, 2010.

* cited by examiner

Primary Examiner — Mark Eashoo
Assistant Examiner — David Karst
(74) Attorney, Agent, or Firm — Sughrue Mion, PLLC

(57) ABSTRACT

The present invention relates to an epoxy resin composition for optical-semiconductor encapsulation which comprises the following ingredients (A) to (C): (A) an epoxy resin; (B) a curing agent; and (C) a naphthalocyanine colorant. The epoxy resin composition of the invention transmits visible rays and shields near infrared rays while retaining properties inherent in the epoxy resin.

5 Claims, 3 Drawing Sheets

TRANSMISSION SPECTRUM FOR DIIMONIUM-CONTAINING RESIN
(1mm-THICK CURED RESIN) <COMPARATIVE EXAMPLE 1>

TRANSMISSION SPECTRUM FOR DIIMONIUM-CONTAINING RESIN
(1mm-THICK CURED RESIN) <COMPARATIVE EXAMPLE 2>

EPOXY RESIN COMPOSITION FOR OPTICAL-SEMICONDUCTOR ENCAPSULATION, CURED RESIN THEREOF, AND OPTICAL SEMICONDUCTOR DEVICE OBTAINED WITH THE SAME

FIELD OF THE INVENTION

The present invention relates to an epoxy resin composition for optical-semiconductor encapsulation which has excellent properties inherent in the epoxy resin, selectively transmits rays in the whole visible light region or specific visible rays, and simultaneously shields near infrared rays. The invention further relates to a cured resin obtained by curing the composition and an optical semiconductor device obtained through resin encapsulation with the epoxy resin composition for optical-semiconductor encapsulation.

BACKGROUND OF THE INVENTION

In cell phones, liquid-crystal TV's, and the like, the number of products having an illuminance sensor for regulating screen brightness has been increasing in recent years. Such an illuminance sensor is required to have the same sensitivity as the human eye. However, there is the following problem. The optical semiconductor element employed is sensitive not only to the visible rays but also to near infrared rays through a wavelength range of about 900 to 1,100 nm. Therefore, the optical semiconductor element, when used in its original state, senses near infrared rays, which are not sensible by human beings, and the sensor judges the environment "bright". For preventing such a problem concerning the illuminance sensor, it is necessary to use an optical filter or the like to prevent the optical semiconductor element from being sensitive to near infrared rays. On the other hand, an epoxy resin composition excellent in heat resistance, impact resistance, transparency, etc. has come to be commercially used as an encapsulating material for optical semiconductors. In producing an illuminance sensor such as that described above, there has been employed a technique in which the upper side of an optical semiconductor element is coated, for example, with an optical filter material having the function of shielding near infrared rays and this optical semiconductor element having the optical filter formed thereon is encapsulated with an epoxy resin composition which is transparent in the visible light region and near infrared region.

In the technical field of such illuminance sensors, there presently is an earnest desire for imparting the optical filtrating function to an epoxy resin itself to be used as an encapsulating resin, for the purposes of eliminating or reducing the step/cost of separately forming an optical filter on the upper surface of an optical semiconductor element and of imparting the function of shielding near infrared rays to the side surfaces of the optical semiconductor element.

On the other hand, besides the use of an optical filter such as that described above, the following techniques of using a material having the function of shielding near infrared rays may be used for imparting the optical filtrating function to an illuminance sensor. For example, a heat-ray-cutting laminated glass for automotive and other uses (see, JP-A-2005-187226), a near-infrared-cutting film used in, e.g., plasma display panels (PDPs), and the like may be applied.

However, the heat-ray-cutting laminated glass used in motor vehicles and other applications has a drawback that a compound which mainly absorbs or reflects middle infrared rays is contained in, e.g., the interlayer of the laminated glass and, hence, this glass is low in the ability to shield near infrared rays and is insufficient for use in the illuminance sensor application in which the invention is intended to be used.

The near-infrared-cutting film used in PDPs and the like is produced by dissolving a colorant absorbing near infrared rays having wavelengths of 800 or 900 nm or longer in poly(ethylene terephthalate) (PET), poly(methyl methacrylate) (PMMA), or the like and then forming this polymer into a film. Consequently, one of the properties required to the colorant is solubility in organic solvents, and dyes such as diimonium salts (see, JP-A-2004-182857) and cyanine colorants (see, JP-A-2004-315789) are used as the colorants for PDPs and the like.

However, the thermal stability of those colorants is about 100° C. at the most because of the steps for producing the near-infrared-cutting film for use in PDPs and for producing the PDPs and because of the environment in which the PDPs are used. That temperature is considerably lower than the curing temperature of resins for optical-semiconductor encapsulation, which should be about 120 to 170° C. Consequently, when a colorant used in PDPs or the like is used, this colorant undergoes alteration such as pyrolysis, due to the action of an acid or basic compound used in raw materials for the resin and due to heating in the step of curing the resin, whereby a problem, for example, that the colorant disadvantageously changes in the optical property of shielding near infrared rays occurs.

SUMMARY OF THE INVENTION

The invention has been achieved under such circumstances. An object of the invention is to provide an epoxy resin composition for optical-semiconductor encapsulation which retains properties inherent in the epoxy resin, transmits visible rays, and shields near infrared rays, by incorporating a colorant which is resistant to acids or bases and to the step of heating in a resin curing reaction and has the function of shielding near infrared rays. Another object of the invention is to provide a cured epoxy resin obtained by curing the composition for optical-semiconductor encapsulation and an optical semiconductor device produced with the epoxy resin composition for optical-semiconductor encapsulation.

The present inventors have made a series of investigations in order to overcome the problem that an epoxy resin composition for optical-semiconductor encapsulation, which contains a conventional colorant which shields near infrared rays, changes in the optical properties of the colorant (in particular, decrease or elimination of the property of shielding near infrared rays) due to heating in molding, etc. As a result, they found that the optical properties can be prevented from deterioration during molding to get a cured resin and during a heat resistance test by using a naphthalocyanine colorant or a combination of a naphthalocyanine colorant and a phthalocyanine colorant. The invention has been thus achieved.

DETAILED DESCRIPTION OF THE INVENTION

Figure 1:
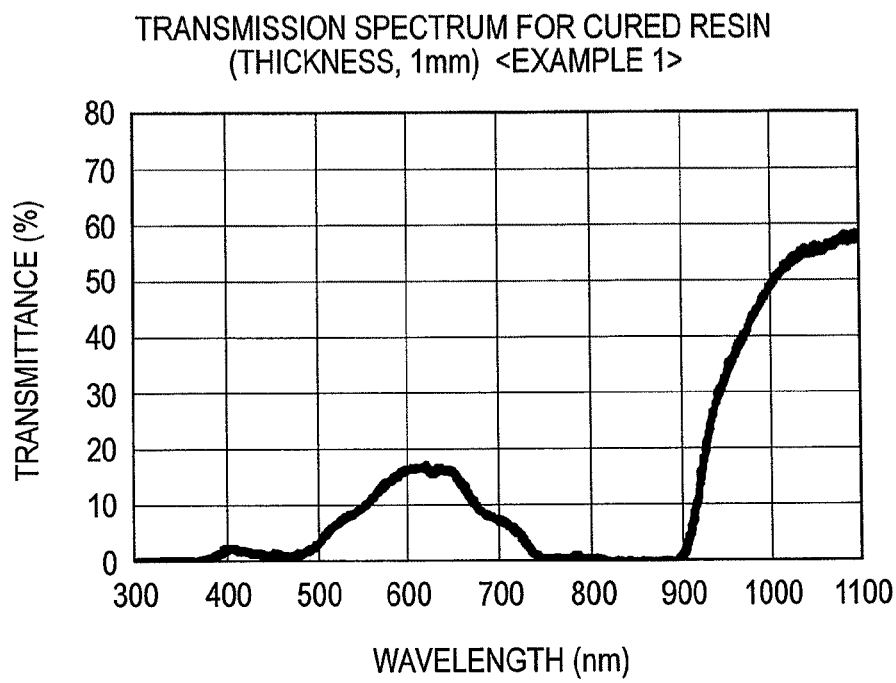
FIG. 1 is a transmission spectrum for the cured resin of Example 1 (thickness, 1 mm).

Namely, the present invention relates to the followings.

(1) An epoxy resin composition for optical-semiconductor encapsulation, which comprises the following ingredients (A) to (C):
(A) an epoxy resin;
(B) a curing agent; and
(C) a naphthalocyanine colorant.

(2) The epoxy resin composition for optical-semiconductor encapsulation according to (1), wherein the ingredient (C) is represented by the following formula (1):

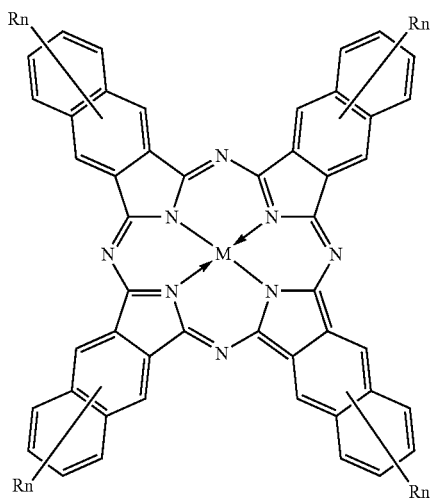

(1)

wherein R's are the same or different and each represent a hydrogen atom, alkyl, alkoxy, alkylthio, arylthio, dialkylamino, nitro, phenyl, anilino, methylanilino, or N-phenyl-N-methylamino;
n is an integer of 0 to 6; and
M is a metal or a metal oxide.

(3) The epoxy resin composition for optical-semiconductor encapsulation according to (2), wherein two or more kinds of naphthalocyanine colorants represented by the formula (1) are used as the ingredient (C), said naphthalocyanine colorants represented by the formula (1) differing from each other in at least one of the atoms, substituents, and metal or metal oxide represented by the R's and M and the n's, which indicate the number of atoms or functional groups.

(4) The epoxy resin composition for optical-semiconductor encapsulation according to (1), wherein the ingredient (C) is contained in an amount in a range of 0.0005 to 0.5 parts by weight with respect to 100 parts by weight of the ingredient (A).

(5) The epoxy resin composition for optical-semiconductor encapsulation according to (1), which contains, in addition to the ingredients (A) to (C), the following ingredient (D):
(D) a phthalocyanine colorant.

(6) The epoxy resin composition for optical-semiconductor encapsulation according to (5), wherein the ingredient (D) is represented by the formula (2):

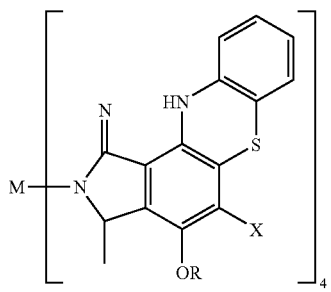

(2)

wherein R is alkyl or alkoxyalkyl;
M is a metal or a metal oxide; and
X is a halogen atom.

(7) The epoxy resin composition for optical-semiconductor encapsulation according to (5), wherein the ingredient (D) is contained in an amount of 0.5 parts by weight or lower with respect to 100 parts by weight of the ingredient (A).

(8) A cured epoxy resin obtainable by curing the epoxy resin composition for optical-semiconductor encapsulation according to (1).

(9) An optical semiconductor device obtainable by encapsulating an optical semiconductor element with the epoxy resin composition for optical-semiconductor encapsulation according to (1).

According to the invention, a naphthalocyanine colorant (ingredient C) is contained in the epoxy resin composition together with the epoxy resin (ingredient A) and curing agent (ingredient B). Accordingly, the epoxy resin composition for optical-semiconductor encapsulation which transmits visible rays and is capable of shielding near infrared rays can be obtained. Additionally, the optical properties of this composition can be prevented from deterioration by an acid or basic compound used as a raw material for the resin composition or by heating in a resin-curing step. Furthermore, the epoxy resin composition for optical-semiconductor encapsulation can retain inherent and excellent properties of the epoxy resin. Consequently, the cured epoxy resin obtained by curing this composition and the optical semiconductor device obtained with the composition are highly reliable.

When two or more naphthalocyanine colorants (ingredient C) are used in combination, the light shielding in the near infrared region can be achieved more effectively.

Furthermore, when a phthalocyanine colorant (ingredient D) is incorporated in addition to ingredients A to C, the light shielding in the near infrared region can be achieved with higher certainty.

The followings described the present invention in more detail.

The epoxy resin composition for optical-semiconductor encapsulation of the invention is obtained from an epoxy resin (ingredient A), a curing agent (ingredient B), and at least one naphthalocyanine colorant (ingredient C). It is used in the form of a liquid or powder or as pellets obtained by tableting the powder.

The epoxy resin (ingredient A) is not particularly limited. Examples thereof include bisphenol A epoxy resins, bisphenol F epoxy resins, novolac epoxy resins such as phenol novolac epoxy resins and cresol novolac epoxy resins, alicyclic epoxy resins, nitrogenous-ring epoxy resins such as ones having an isocyanuric-ring framework and hydantoin epoxy resins, hydrogenated bisphenol A epoxy resins, hydrogenated bisphenol F epoxy resins, aliphatic epoxy resins, glycidyl ester epoxy resins, bisphenol S epoxy resins, biphenyl epoxy resins which are mainly used as the type giving low-water-absorption cured resins, dicyclic epoxy resins, and naphthalene epoxy resins. These epoxy resins may be used alone or in combination of two or more thereof. It is preferred to use a bisphenol A epoxy resin, bisphenol F epoxy resin, novolac epoxy resin, alicyclic epoxy resin, or epoxy resin having an isocyanuric-ring framework among those epoxy resins because they are excellent in transparency and unsusceptibility to discoloration.

Those epoxy resins may be solid or liquid at ordinary temperature. However, it is generally preferred to use an epoxy resin having an average epoxy equivalent of 90 to 1,000. In the case of a solid epoxy resin, it preferably is one having a softening point of 160° C. or lower. The reasons for the preference of such epoxy equivalents are as follows. In the case where an epoxy resin having an epoxy equivalent lower than 90 is used, the epoxy resin composition for optical-semiconductor encapsulation tends to give a brittle cured resin. In the case where an epoxy resin having an epoxy equivalent exceeding 1,000 is used, it tends to give a cured resin which has a lowered glass transition temperature (Tg) and cannot satisfy the thermal stability required for optical-semiconductor materials.

Examples of the curing agent (ingredient B) include acid anhydride curing agents and phenolic curing agents. Examples of the acid anhydride curing agents include phthalic anhydride, maleic anhydride, trimellitic anhydride, pyromellitic anhydride, hexahydrophthalic anhydride, tetrahydrophthalic anhydride, methylnadic anhydride, nadic anhydride, glutaric anhydride, methylhexahydrophthalic anhydride, and methyltetrahydrophthalic anhydride. These may be used alone or in combination of two or more thereof. Preferred of these acid anhydride curing agents are phthalic anhydride, hexahydrophthalic anhydride, tetrahydrophthalic anhydride, and methylhexahydrophthalic anhydride. Preferred acid anhydride curing agents are ones having a molecular weight of about 140 to 200. Furthermore, acid anhydride curing agents which are colorless or light-yellow are preferred.

Examples of the phenolic curing agents include resol type phenolic resins, novolac type phenolic resins, and polyhydroxystyrene resins. Examples of the resol type phenolic resins include aniline-modified resol resins and melamine-modified resol resins. Examples of the novolac type phenolic resins include phenol novolac resins, cresol novolac resins, tert-butylphenol novolac resins, nonylphenol novolac resins, naphthol novolac resins, dicyclopentadiene-modified phenolic resins, terpene-modified phenolic resins, triphenolmethane type resins, phenol aralkyl resins (which have a phenylene skeleton, diphenylene skeleton, etc.), and naphthol aralkyl resins. Examples of the polyhydroxystyrene resins include poly(p-hydroxystyrene).

The mixing proportion of the epoxy resin (ingredient A) with respect to the curing agent (ingredient B) preferably is such that the amount of the active group (acid anhydride group or hydroxyl group) in the curing agent which is reactive with an epoxy group is 0.5 to 1.5 equivalents, especially 0.7 to 1.2 equivalents, with respect to the epoxy groups in the epoxy resin. The reasons for this are as follows. In the case where the amount of the active group is smaller than 0.5 equivalents, the epoxy resin composition for optical-semiconductor encapsulation tends to have a reduced curing rate and give a cured resin having a lowered glass transition temperature. On the other hand, in the case where the amount thereof exceeds 1.5 equivalents, moisture resistance tends to decrease.

Besides the acid anhydride curing agents and the phenolic curing agents, conventional curing agents for epoxy resins can be used as the curing agent (ingredient B) according to the intended use and application of the composition. Examples of the conventional curing agents for epoxy resins include amine curing agents, the acid anhydride curing agents enumerated above which have been partly esterified with an alcohol, and carboxylic acid curing agents such as hexahydrophthalic acid, tetrahydrophthalic acid, and methylhexahydrophthalic acid. These may be used alone or in combination of two or more thereof, and may be used in combination with one or more of the acid anhydride curing agents and phenolic curing agents. For example, when a carboxylic acid curing agent is used in combination, curing rate can be increased, whereby the productivity can be improved. In the case of using these curing agents, they may be incorporated in the same proportion (ratio by equivalent) as in the case of using an acid anhydride curing agent and a phenolic curing agent.

The naphthalocyanine colorant (ingredient C) to be used together with ingredient A and ingredient B is not particularly limited. However, it preferably is a naphthalocyanine colorant represented by the following general formula (1):

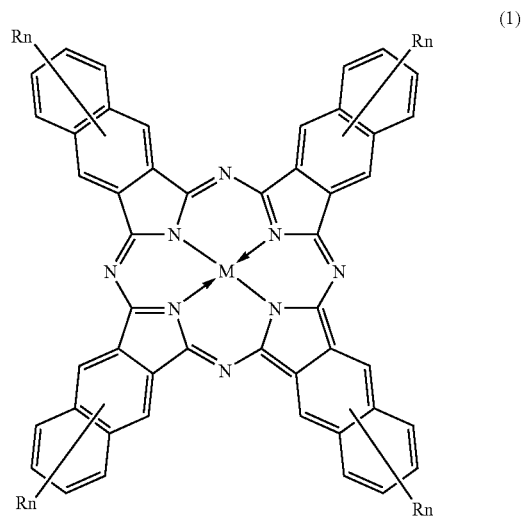

(1)

(wherein, R's are the same or different and each represent a hydrogen atom, alkyl, alkoxy, alkylthio, arylthio, dialkylamino, nitro, phenyl, anilino, methylanilino, or N-phenyl-N-methylamino; n is an integer of 0 to 6; and M is a metal or a metal oxide).

It is also preferred to use a combination of two or more of such naphthalocyanine colorants which differ from each other in at least one of the atoms, substituents, and metal or metal oxide represented by the R's and M and the n's, which indicate the number of atoms or functional groups. This is because use of the combination of two or more of different naphthalocyanine colorants is preferred from the standpoints of preventing optical properties from being deteriorated by heating, etc. and of obtaining the desired excellent property of shielding near infrared rays.

In general formula (1), R's are the same or different and each represent a hydrogen atom, alkyl, alkoxy, alkylthio, arylthio, dialkylamino, nitro, phenyl, anilino, methylanilino, or N-phenyl-N-methylamino.

For example, when R is alkyl, it preferably is linear or branched alkyl having 1 to 15 carbon atoms, and especially preferably is linear or branched alkyl having 1 to 8 carbon atoms. Examples thereof include methyl, ethyl, n-propyl, isopropyl, n-butyl, isobutyl, sec-butyl, tert-butyl, n-pentyl, isopentyl, tert-pentyl, n-hexyl, isohexyl, n-heptyl, isoheptyl, sec-heptyl, n-octyl, tert-octyl, 2-ethylhexyl, and n-dodecyl.

When R is alkoxy, it preferably is linear, branched, or cyclic alkoxy having 1 to 15 carbon atoms in total, and especially preferably is linear, branched, or cyclic alkoxy having 1 to 8 carbon atoms in total. Examples thereof include methoxy, ethoxy, n-propoxy, isopropoxy, n-butoxy, isobutoxy, sec-butoxy, tert-butoxy, n-pentyloxy, isopentyloxy, n-hexyloxy, cyclohexyloxy, n-heptyloxy, isoheptyloxy, sec-heptyloxy, n-octyloxy, 2-ethylhexyloxy, methoxyethoxy, methoxypropoxy, methoxybutoxy, ethoxyethoxy, ethoxypropoxy, ethoxybutoxy, n-propoxyethoxy, isopropoxyethoxy, (2-methoxyethoxy)methoxy, (2-ethoxyethoxy)methoxy, 2-(2-methoxyethoxy)ethoxy, 2-(1-methoxyethoxy)ethoxy, 2-(2-ethoxyethoxy)ethoxy, 2-(propoxyethoxy)ethoxy, 3-(2-methoxyethoxy)propoxy, 3-(2-ethoxyethoxy)propoxy, 2-methylthioethoxy, 2-ethylthioethoxy, and 2-dimethylaminoethoxy.

When R is alkylthio, it preferably is linear, branched, or cyclic alkylthio having 1 to 15 carbon atoms in total, and especially preferably is linear, branched, or cyclic alkylthio having 1 to 8 carbon atoms in total. Examples thereof include methylthio, ethylthio, n-propylthio, isopropylthio, n-butylthio, sec-butylthio, tert-butylthio, n-pentylthio, isopentylthio, n-hexylthio, cyclohexylthio, and n-octylthio.

When R is arylthio, examples thereof include phenylthio, p-methylphenylthio, p-tert-butylphenylthio, and naphthylthio.

When R is dialkylamino, each alkyl preferably is linear, branched, or cyclic alkyl having 1 to 12 carbon atoms, and especially preferably is linear, branched, or cyclic alkyl having 1 to 8 carbon atoms. Examples thereof include dimethylamino, diethylamino, di-n-propylamino, diisopropylamino, di-n-butylamino, diisobutylamino, di-n-pentylamino, di-n-hexylamino, di-n-heptylamino, di-n-octylamino, N-ethyl-N-methylamino, N-isopropyl-N-ethylamino, N-sec-butyl-N-ethylamino, N-isopentyl-N-ethylamino, N-cyclohexyl-N-methylamino, N-sec-heptyl-N-ethylamino, and N-(2-ethylhexyl)-N-butylamino.

In general formula (1), n, which indicates the number of atoms or functional groups, is an integer of 0 to 6. From the standpoint of availability, naphthalocyanine colorants in which n is 0 to 2 are preferred.

In general formula (1), M is a metal or a metal oxide. Preferred examples of the metal represented by M include Cu, Zn, Fe, Co, Ni, Ru, Pb, Rh, Pd, Pt, Mn, Sn, and V. Preferred examples of the metal oxide include VO and TiO. Especially preferred of these metals and metal oxides include Cu, Ni, Co, Zn, VO, Pd, and V.

The amount of the naphthalocyanine colorant (ingredient C) to be added is generally in the range of 0.0005 to 0.5 parts by weight (hereinafter abbreviated to "parts") with respect to 100 parts of the epoxy resin (ingredient A). The amount thereof is preferably in the range of 0.001 to 0.3 parts. The reasons for this are as follows. In the case where the amount thereof is smaller than 0.0005 parts, the property of shielding near infrared rays tends to decrease. In the case where the amount thereof exceeds 0.5 parts, the property of transmitting rays in the whole visible light region or specific visible rays tends to decrease. Incidentally, the amount of the colorant to be added is in the case where the resin thickness is 1 mm and the range changes proportionally with changing resin thickness.

A phthalocyanine colorant (ingredient D) may be optionally incorporated together with ingredient A to ingredient C in the invention. The phthalocyanine colorant is not particularly limited. However, from the standpoint of further improving the desired near infrared ray shielding, it preferably is a phthalocyanine colorant represented by the following general formula (2):

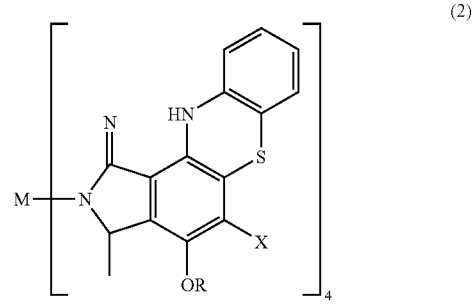

(2)

(wherein, R is alkyl or alkoxyalkyl; M is a metal or a metal oxide; and X is a halogen atom).

Examples of the phthalocyanine colorant represented by general formula (2) include phthalocyanine colorants represented by the following general formulae (3) to (6):

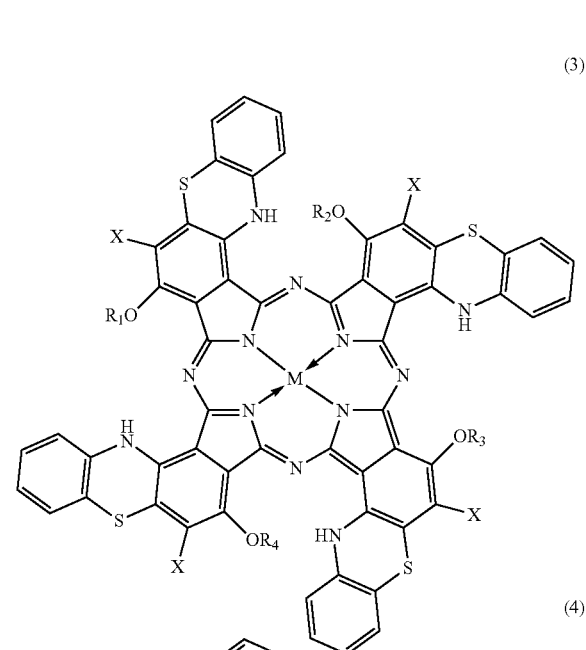

(3)

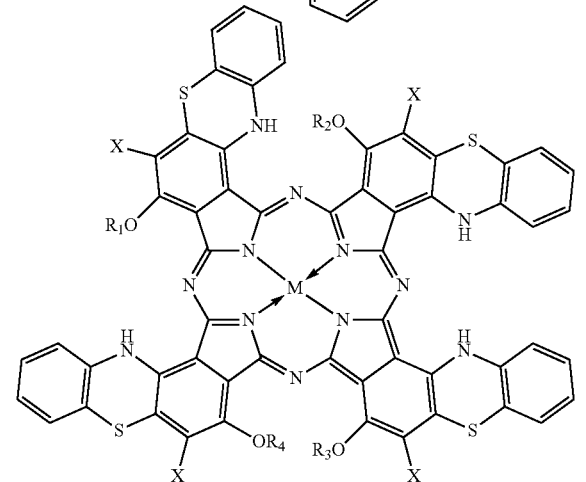

(4)

(5)

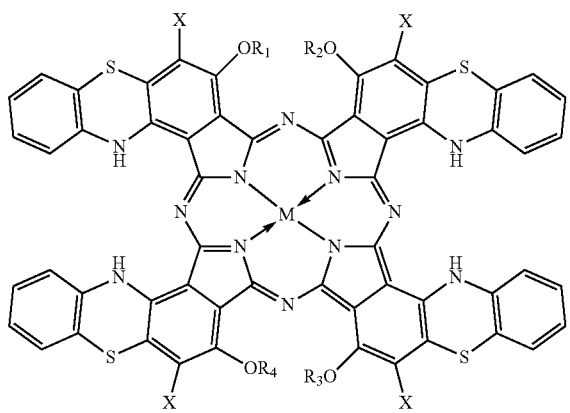

(6)

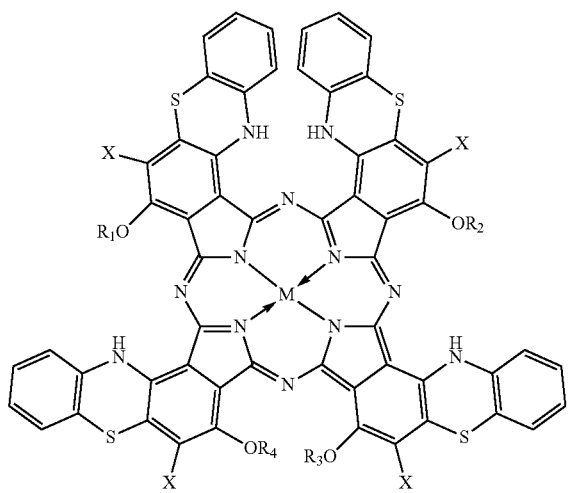

(wherein, $R_1$ to $R_4$ are the same or different and each are alkyl or alkoxyalkyl; M is a metal or a metal oxide; and X is a halogen atom).

However, the compounds represented by general formula (3) are apt to be mainly yielded due to the steric hindrance of substituents.

In general formulae (2) to (6), R or $R_1$ to $R_4$ each are alkyl or alkoxyalkyl. Although the substituents $R_1$ to $R_4$ are the same or different, it is especially preferred that all of $R_1$ to $R_4$ be the same substituent. When R or $R_1$ to $R_4$ are alkyl, it preferably is linear or branched alkyl having 1 to 12 carbon atoms, and especially preferably is linear or branched alkyl having 1 to 8 carbon atoms. Examples thereof include methyl, ethyl, n-propyl, isopropyl, n-butyl, isobutyl, sec-butyl, n-pentyl, isopentyl, neopentyl, n-heptyl, isoheptyl, sec-heptyl, n-octyl, and 2-ethylhexyl.

When R or $R_1$ to $R_4$ are alkoxyalkyl, it preferably is one having 2 to 8 carbon atoms in total, and especially preferably is one having 3 to 6 carbon atoms in total. Examples thereof include methoxyethyl, methoxypropyl, methoxybutyl, ethoxyethyl, ethoxypropyl, ethoxybutyl, n-propoxyethyl, and isopropoxyethyl.

In general formulae (2) to (6), M is a metal or a metal oxide. Preferred examples of the metal represented by M include Cu, Zn, Fe, Co, Ni, Ru, Pb, Rh, Pd, Pt, Mn, Sn, and V. Preferred examples of the metal oxide include VO and TiO. Especially preferred of these metals and metal oxides include Cu, Ni, Co, Zn, V, VO, and Pd.

In general formulae (2) to (6), X is a halogen atom. Preferred examples thereof include a chlorine atom, a bromine atom, and a fluorine atom. Especially preferred is a chlorine atom.

The phthalocyanine colorant (ingredient D) is an optional ingredient and, hence, need not be always added. The amount of this colorant to be added is preferably 0.5 parts or lower with respect to 100 parts of the epoxy resin (ingredient A). An especially preferred range thereof is from 0.001 to 0.3 parts. This is because in the case where the amount thereof exceeds 0.5 parts, the property of transmitting rays in the whole visible light region or specific visible rays tend to decrease. Incidentally, that amount of the colorant to be added is in the case where the resin thickness is 1 mm, and the range changes proportionally with changing resin thickness.

The naphthalocyanine colorant (ingredient C) and the phthalocyanine colorant (ingredient D), especially the naphthalocyanine colorant, are crucial for realizing an epoxy resin composition which shields near infrared rays and undergoes little or no change in optical properties during molding or in a heat resistance test. As the colorants, ones classified as pigments are preferable to ones classified as dyes from the standpoint of thermal stability.

With respect to transmission and light shielding properties, the composition preferably is one which gives a 1 mm-thick molded object having a transmittance maximum of 10% or higher, especially 20% or higher, in the visible light region (450 to 650 nm) and a transmittance in the near infrared region (750 to 900 nm) of 5% or lower.

Various conventional additives such as a curing accelerator, deterioration inhibitor, modifier, coupling agent, defoamer, leveling agent, release agent, dye, and pigment may be suitably incorporated into the epoxy resin composition for optical-semiconductor encapsulation of the invention.

The curing accelerator is not particularly limited. Examples thereof include tertiary amines such as 1,8-diazabicyclo[5.4.0]undecane-7, triethylenediamine, and tri-2,4,6-dimethylaminomethylphenol, imidazole compounds such as 1-butyl-2-methylimidazole, 1-butyl-2-phenylimidazole, 2-methyl-4-methylimidazole, and 2-methylimidazole, phosphorus compounds such as triphenyl phosphine and tetraphenylphosphonium tetraphenylborate, quaternary ammonium salts, metal salts, and derivatives thereof. These may be used alone or in combination of two or more thereof. Preferred examples of those curing accelerators include tertiary amines, imidazole compounds, and phosphorus compounds.

The content of the curing accelerator is preferably 0.01 to 8.0 parts, more preferably 0.1 to 3.0 parts, based on 100 parts of the epoxy resin (ingredient A). The reasons for this are as follows. When the content of the curing accelerator is lower than 0.01 part, there are cases where a sufficient curing-accelerating effect is not obtained. In the case where the content thereof exceeds 8.0 parts, problems concerning, e.g., discoloration of the cured resin obtained are apt to arise.

Examples of the deterioration inhibitor include phenol compounds, amine compounds, organosulfur compounds, and phosphine compounds. Examples of the modifier include glycols, silicones, and alcohols. Examples of the coupling agent include silane coupling agents and titanate coupling agents. Examples of the defoamer include silicone defoamers. Such compounds shown as examples of each additive may be used alone or in combination of two or more thereof.

The epoxy resin composition for optical-semiconductor encapsulation of the invention can be produced, for example, by the following manner. The composition can be thereby obtained in the form of a liquid or powder or as tablets obtained by tableting the powder. For obtaining the liquid epoxy resin composition for optical-semiconductor encapsulation, a method may, for example, be used in which the ingredients described above, i.e., the epoxy resin (ingredient A), curing agent (ingredient B), and naphthalocyanine colorant (ingredient C) are suitably mixed optionally together with the phthalocyanine colorant (ingredient D) and other additives.

For obtaining the composition as a powder or as tablets obtained by tableting the powder, use may be made, for example, of a method including premixing the ingredients in a suitable proportion, thereafter kneading and melt-mixing the ingredients by means of a kneading machine, subsequently cooling the mixture to room temperature, and then pulverizing the mixture by a known technique and optionally tableting the resultant powder.

The epoxy resin composition for optical-semiconductor encapsulation of the invention thus obtained is used as an encapsulating resin for optical semiconductor elements such as LEDs and optical sensors. The encapsulation of an optical semiconductor element with the epoxy resin composition for optical-semiconductor encapsulation of the invention is not particularly limited, and can be conducted by a known molding technique such as ordinary transfer molding or potting. In the case where the epoxy resin composition for optical-semiconductor encapsulation of the invention is liquid, it may be used as the so-called two-pack type, in which the epoxy resin and the curing agent are stored separately from each other and are mixed together just before use. In the case where the epoxy resin composition for optical-semiconductor encapsulation of the invention is in the form of a powder or tablets, a method may be used in which the ingredients, when melt-mixed, are brought into a B-stage state and the resultant composition is thermally melted when used.

When the epoxy resin composition for optical-semiconductor encapsulation of the invention is used to form a plate-like or lens-like cured object or encapsulate an optical semiconductor element, the function of transmitting target visible rays and shielding target near infrared rays can be imparted to the cured object or optical semiconductor device obtained, while maintaining excellent properties of the epoxy resin composition (high heat resistance and high adhesiveness).

The invention will be explained below by reference to Examples and Comparative Examples. However, the invention should not be construed as being limited to the following Examples.

EXAMPLES

Examples 1 to 3

A phthalocyanine colorant and naphthalocyanine colorants were added in the amounts shown in Table 1 below to a mixture composed of 100 parts of an epoxy resin, 99 parts of a curing agent, and 1 part of a curing accelerator as shown in the table.

Figure 2:
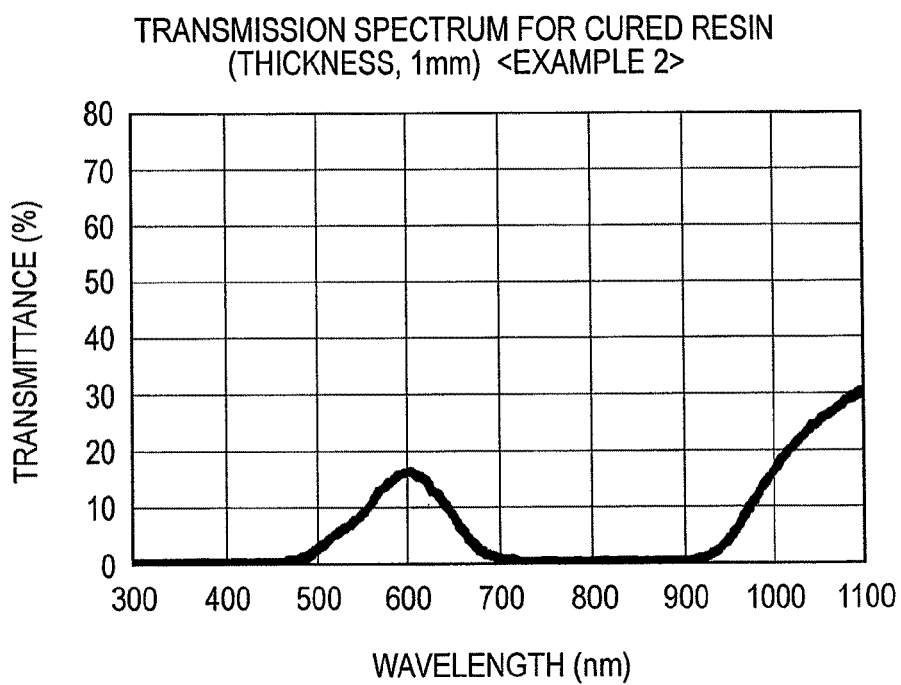
FIG. 2 is a transmission spectrum for the cured resin of Example 2 (thickness, 1 mm).
Figure 3:
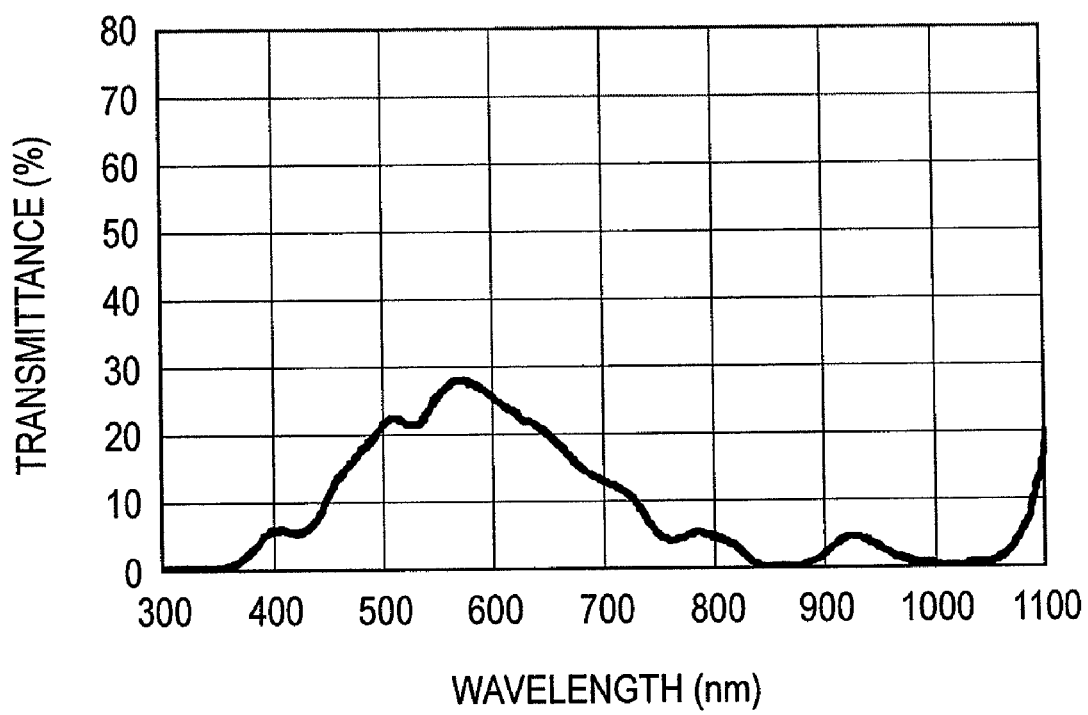
FIG. 3 is a transmission spectrum for the cured resin of Example 3 (thickness, 1 mm).

Each liquid resin composition obtained (epoxy resin composition for optical-semiconductor encapsulation) was poured into a mold having a thickness of 1 mm and heated at 150° C. for 3 hours to obtain a cured resin composition. This cured resin composition (1-mm thick) was examined with apparatus UV-3101PC (manufactured by Shimadzu Corp.) for a transmission spectrum. The results obtained are shown in FIG. 1 (Example 1), FIG. 2 (Example 2), and FIG. 3 (Example 3). As apparent from FIGS. 1 to 3, the cured resins obtained in Examples 1 to 3 had a transmittance in the near infrared region (750 to 900 nm) of 5% or lower.

Comparative Examples 1 and 2

Figure 4:
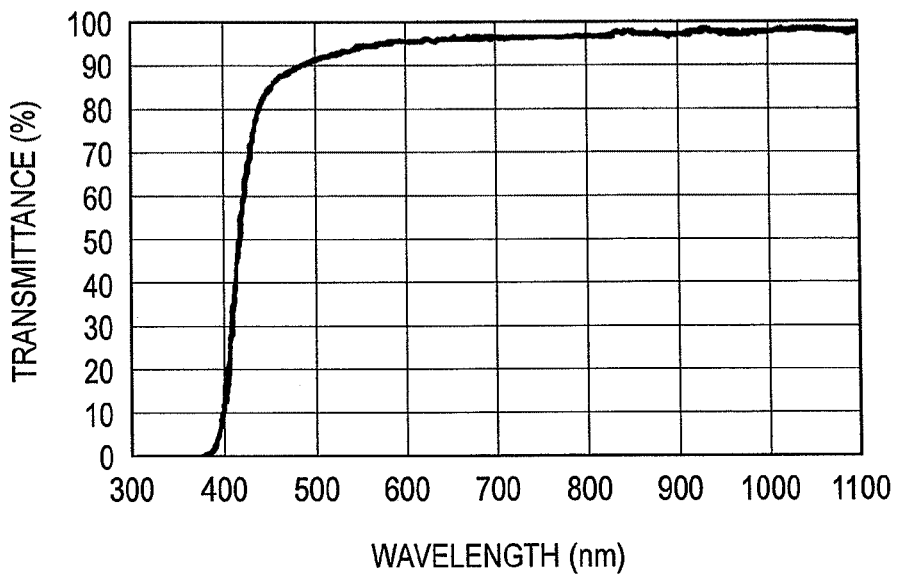
FIG. 4 is a transmission spectrum for the cured resin of Comparative Example 1 (thickness, 1 mm).
Figure 5:
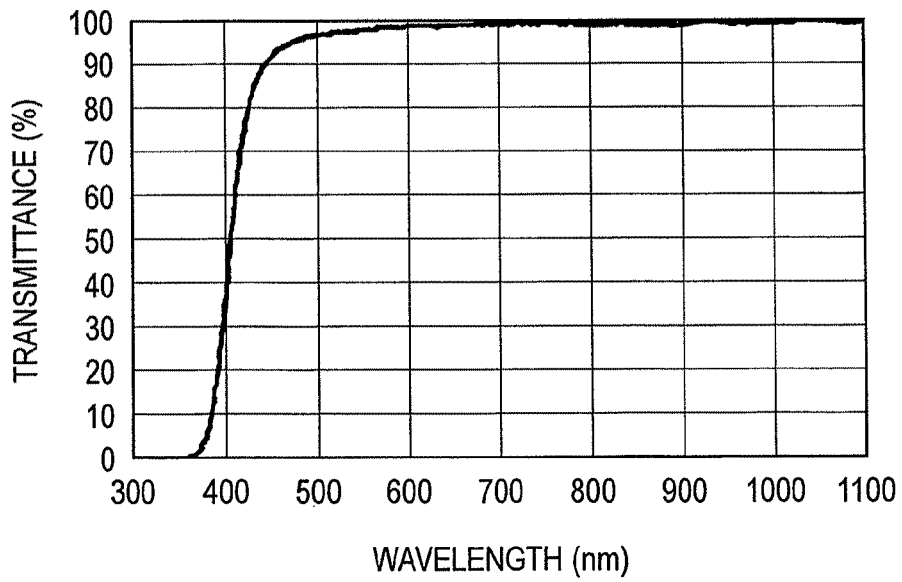
FIG. 5 is a transmission spectrum for the cured resin of Comparative Example 2 (thickness, 1 mm).

Liquid resin compositions were obtained in the same manner as in Example 1, except that a diimonium dye was incorporated in the amount shown in Table 1 in place of the naphthalocyanine colorant used in Example 1. Each liquid resin composition obtained was poured into a mold having a thickness of 1 mm and heated at 150° C. for 3 hours to obtain a cured resin. This cured resin composition was examined with the apparatus for a transmission spectrum. The results obtained are shown in FIG. 4 (Comparative Example 1) and FIG. 5 (Comparative Example 2). In the Comparative Examples shown in FIGS. 4 and 5, the transmittances of near infrared rays are considerably high.

As shown above, in each of Examples 1 to 3, the near-infrared-ray transmittance is 5% or lower and the desired property is observed. On the other hand, in Comparative Examples 1 and 2, the infrared-ray shielding properties of the diimonium dyes used are lost in the heating step for curing the resins. Consequently, it can be seen that the desired property of shielding near infrared rays can be imparted to a thermoset resin by using one or more naphthalocyanine colorants or a combination of one or more naphthalocyanine colorants and a phthalocyanine colorant, as in the invention.

TABLE 1

| | (parts by weight) | | | | |
| | Example | | | Comparative Example | |
| | 1 | 2 | 3 | 1 | 2 |
|---|---|---|---|---|---|
| Epoxy resin*1 | 100 | 100 | 100 | 100 | 100 |
| Curing agent*2 | 99 | 99 | 99 | 99 | 99 |
| Curing accelerator*3 | 1 | 1 | 1 | 1 | 1 |
| Naphthalocyanine colorant*4 | 0.018 | 0.018 | 0.005 | — | — |
| Naphthalocyanine colorant*5 | — | 0.018 | — | — | — |
| Phthalocyanine colorant*6 | — | — | 0.060 | — | — |
| Diimonium*7 | — | — | — | 0.400 | — |
| Diimonium*8 | — | — | — | — | 0.400 |

*1: JER-827, manufactured by Japan Epoxy Resins Co., Ltd.
*2: NH-8210, manufactured by Hitachi Chemical Co., Ltd.
*3: Polycat 8, manufactured by San-Apro Ltd.
*4: copper(II) 5,9,14,18,23,27,32,36-octabutoxy-2,3-naphthalocyanine (CAS No. 155773-67-4).
*5: vanadyl-2,3-naphthalocyanine (CAS No. 33273-15-3).
*6: represented by general formula (7) and showing an absorption maximum wavelength of 1,005 nm and a gram extinction coefficient of $7.75 \times 10^4$ (mL/g.cm) in toluene solution.

TABLE 1-continued

|  | Example | | | Comparative Example | |
|---|---|---|---|---|---|
|  | 1 | 2 | 3 | 1 | 2 |

[In formula (7), $R_3$ is isopentyl, M is vanadyl, and X is chlorine atom.]
*7: IRG-022, manufactured by Nippon Kayaku Co., Ltd.
*8: IRG-068, manufactured by Nippon Kayaku Co., Ltd.

The evaluation results show that the resin compositions of the Examples each gave a cured resin composition which transmitted the target visible rays and could almost shield the target near infrared rays. In particular, in Examples 1 and 2, the light rays in the target near infrared region (750 to 900 nm) could be almost completely shielded.

In contrast, the cured resin compositions obtained in Comparative Examples 1 and 2 each failed to attain the desired property of shielding near infrared rays.

While the present invention has been described in detail and with reference to specific embodiments thereof, it will be apparent to one skilled in the art that various changes and modifications can be made therein without departing from the scope thereof.

This application is based on Japanese patent application No. 2006-255410 filed Sep. 21, 2006 and Japanese patent application No. 2007-145913 filed May 31, 2006, the entire contents thereof being hereby incorporated by reference.

Further, all references cited herein are incorporated in their entireties.

What is claimed is:

1. An epoxy resin composition for optical-semiconductor encapsulation, which comprises the following ingredients (A) to (D):

(A) an epoxy resin;

(B) a curing agent;

(C) a naphthalocyanine colorant, and (D) a phthalocyanine colorant, wherein the composition has a maximum transmittance of 10% or higher in the visible light region of from 450 to 650 nm and a transmittance in the near infrared region of from 750 to 900 nm of 5% or lower when being molded into a 1 mm thick molded object, wherein the naphthalocyanine colorant and the phthalocyanine colorant are each present in an amount of 0.001 to 0.3 parts by weight with respect to 100 parts by weight of the epoxy resin, wherein the ingredient (D) is represented by the formula (2):

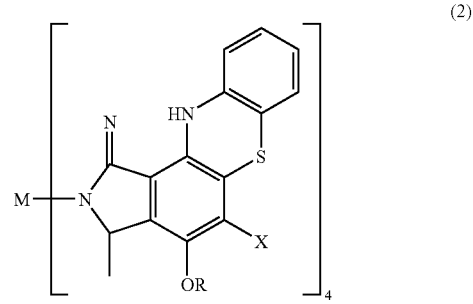

wherein R is alkyl or alkoxyalkyl; M is a vanadyl; and X is a halogen atom.

2. The epoxy resin composition for optical-semiconductor encapsulation according to claim 1, wherein the ingredient (C) is represented by the following formula (1):

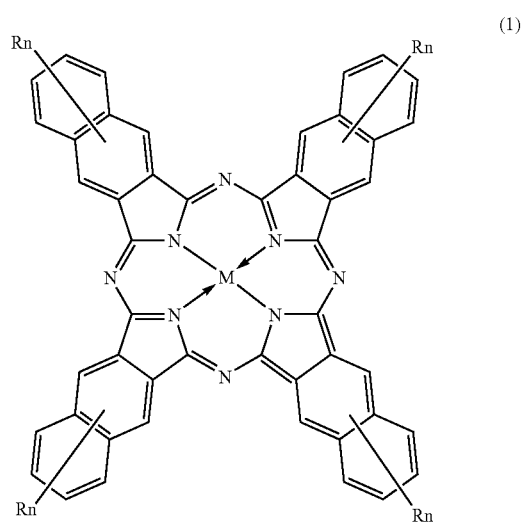

wherein R's are the same or different and each represent a hydrogen atom, alkyl, alkoxy, alkylthio, arylthio, dialkylamino, nitro, phenyl, anilino, methylanilino, or N-phenyl-N-methylamino;

n is an integer of 0 to 6; and

M is a metal or a metal oxide.

3. The epoxy resin composition for optical-semiconductor encapsulation according to claim 2, wherein two or more kinds of naphthalocyanine colorants represented by the formula (1) are used as the ingredient (C), said naphthalocyanine colorants represented by the formula (1) differing from each other in at least one of the atoms, substituents, and metal or metal oxide represented by the R's and M and the n's, which indicate the number of atoms or functional groups.

4. A cured epoxy resin obtainable by curing the epoxy resin composition for optical-semiconductor encapsulation according to claim 1.

5. An optical semiconductor device comprising an optical semiconductor element and an epoxy resin composition for optical-semiconductor encapsulation comprising the following ingredients (A) to (D): (A) an epoxy resin; (B) a curing agent; (C) a napthalocyanine colorant; and (D) a phthalocyanine colorant, wherein the composition has a maximum transmittance of 10% or higher in the visible light region of from 450 to 650 nm and a transmittance in the near infrared region of from 750 to 900 nm of 5% or lower when being molded into a 1 mm thick molded object, and wherein the epoxy resin composition encapsulates the optical semiconductor, wherein the naphthalocyanine colorant and the phthalocyanine colorant are each present in an amount of 0.001 to 0.3 parts by weight with respect to 100 parts by weight of the epoxy resin, wherein the ingredient (D) is represented by the formula (2):

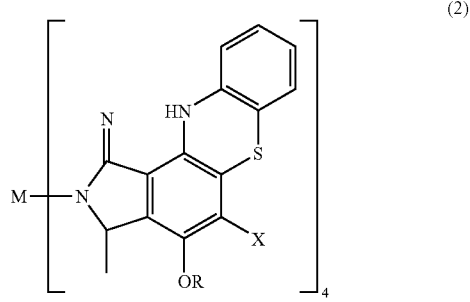

wherein R is alkyl or alkoxyalkyl; M is a vanadyl; and X is a halogen atom.

* * * * *